United States Patent
Nastase et al.

(10) Patent No.: US 10,139,440 B2
(45) Date of Patent: Nov. 27, 2018

(54) SYSTEM AND METHOD FOR DETECTING THE PRESENCE AND TYPE OF CAPACITIVE LOADS

(71) Applicant: NEWPORT CORPORATION, Irvine, CA (US)

(72) Inventors: Adrian Nastase, Huntington Beach, CA (US); Jesus Delvalle, Irvine, CA (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 15/850,349

(22) Filed: Dec. 21, 2017

(65) Prior Publication Data

US 2018/0113159 A1 Apr. 26, 2018

Related U.S. Application Data

(63) Continuation of application No. 14/440,783, filed as application No. PCT/US2013/065935 on Oct. 21, 2013, now Pat. No. 9,857,405.

(Continued)

(51) Int. Cl.
  *G01R 27/26* (2006.01)
  *H01L 41/04* (2006.01)
  (Continued)

(52) U.S. Cl.
  CPC ........ *G01R 27/2605* (2013.01); *H01L 41/042* (2013.01); *H02N 2/142* (2013.01); *G01R 31/343* (2013.01)

(58) Field of Classification Search
  CPC .. G01R 27/2605; G01R 31/343; H02N 2/142; H01L 41/042
  (Continued)

(56) References Cited

U.S. PATENT DOCUMENTS 7,467,543 B2 12/2008 Schoor et al.
7,525,783 B2  4/2009 Chemisky et al.
(Continued)

FOREIGN PATENT DOCUMENTS

CN    1871429 A    11/2006
CN   102256403     11/2011
(Continued)

OTHER PUBLICATIONS

Chinese Pat Appln. No. 201380057964.3. Applicant: Newport Corporation. First Office Action & Search Report (Translation, dated Mar. 2, 2017).

(Continued)

*Primary Examiner* — Melissa Koval
*Assistant Examiner* — Trung Nguyen
(74) *Attorney, Agent, or Firm* — Loza & Loza, LLP; George Fountain

(57) ABSTRACT

System and method for detecting the presence and type of capacitive load that may be coupled to a power driver. The system includes a detection circuit to determine the presence and type of load based on a measured characteristic of the load in response to a drive voltage. The characteristic may be the load capacitance as measured by the current flow between the driver and load. The circuit may include a differential amplifier to generate a current-related voltage, comparators to generate pulses when the voltage exceeds respective thresholds, registers to output logic levels in response to the comparators, and a microcontroller to make the determination based on the logic levels. Alternatively, the circuit includes a differential amplifier to generate a current-related voltage, a rectifier to rectify the voltage, a peak and hold circuit to hold the peak voltage, an ADC to digitize the peak voltage, and a microcontroller to make its determination based on the digitized voltage.

18 Claims, 8 Drawing Sheets

Related U.S. Application Data

(60) Provisional application No. 61/723,246, filed on Nov. 6, 2012.

(51) Int. Cl.
*H02N 2/14* (2006.01)
*G01R 31/34* (2006.01)

(58) Field of Classification Search
USPC ....... 324/671, 672, 600, 200, 229, 635, 644, 324/662, 699, 713–716, 500, 658, 727, 324/76.11, 76.49, 109, 129; 349/149, 349/153, 138, 155; 345/87–100
See application file for complete search history.

(56) References Cited

U.S. PATENT DOCUMENTS

| 9,012,793 B2 | 4/2015 | Reynolds |
| 2006/0067024 A1 | 3/2006 | Chemisky et al. |
| 2007/0040871 A1* | 2/2007 | Urano ..................... B41J 11/42 347/68 |
| 2008/0186339 A1 | 8/2008 | Kondoh |
| 2009/0001998 A1 | 1/2009 | Tateishl |
| 2009/0121724 A1 | 5/2009 | Perryman |
| 2011/0234104 A1* | 9/2011 | Mishima ................ H05B 33/08 315/129 |
| 2011/0316578 A1 | 12/2011 | Mizutani et al. |
| 2012/0007910 A1 | 1/2012 | Lee |
| 2013/0187631 A1 | 7/2013 | Tateishl |

FOREIGN PATENT DOCUMENTS

| JP | 2010076329 A | 4/2010 |
| JP | 2010260054 | 11/2010 |
| JP | 2011204611 | 10/2011 |

OTHER PUBLICATIONS

European Patent Appln. No. EP13853505.9. Applicant: Newport Corporation. Extended Search Report (dated Aug. 24, 2016).
European Patent Appln. No. EP13853505.9. Applicant: Newport Corporation. Partial Supplementary European Search Report (dated May 9, 2016).

* cited by examiner

SYSTEM AND METHOD FOR DETECTING THE PRESENCE AND TYPE OF CAPACITIVE LOADS

CROSS-REFERENCE TO RELATED APPLICATIONS

This application is a continuation of patent application Ser. No. 14/440,783, filed on May 5, 2015, which, in turn, claims the benefit of the filing date of PCT Application, Serial No. PCT/US13/065935, filed on Oct. 21, 2013, which, in turn, claims the benefit of Provisional Application, Ser. No. 61/723,246, filed on Nov. 6, 2012, all of which are incorporated herein by reference.

FIELD

This disclosure relates generally to capacitive loads, such as piezoelectric actuators including picomotors, and in particular, to a system and method for detecting the presence and type of capacitive loads connected to a power driver.

BACKGROUND

Piezoelectric actuators are typically employed in motion control systems that require very high resolution and controllable movements of objects. For example, these devices are often employed in optical measurement systems to perform very precise and controllable rotational movements of stages, mounts, and other components. NEW FOCUS™, which is part of Newport Corporation, manufactures and markets a piezoelectric actuator called PICOMOTER™, often used in various optical applications. Hereinafter piezoelectric actuators will be referred to as PICOMOTER™. In use, PICOMOTERS™ may achieve rotational movements as small as or smaller than 0.6 milliradian (mrad). Another benefit of PICOMOTERS™ is that they are able to retain their last position when they are powered off and subsequently turned on again.

Generally, PICOMOTERS™ and similar piezoelectric actuators are driven with relatively high voltage sources. For example, some piezoelectric actuators are driven with a drive voltage having peak value of around 120 Volts. The drive voltage actuates a piezoelectric material and causes the material to expand in a linear direction. A rotor or wheel is frictionally coupled to the piezoelectric material. For example, a PICOMOTER™ uses the principle of dynamic and static friction in order to rotate the rotor or wheel in a specified direction. The drive voltage waveform, which usually takes the form of a defined pulse, is typically configured to rotate the rotor or wheel in the desired clockwise or counter-clockwise direction.

For example, if the drive voltage waveform has a relatively slow rising edge and a relatively fast falling edge, the rotor or wheel will rotate during the rising edge due to significant friction, and not substantially rotate during the falling edge due to slippage. Conversely, if the drive voltage waveform has a relatively fast rising edge and a relatively slow falling edge, the rotor or wheel will substantially not rotate during the rising edge due to slippage, and rotate during the falling edge.

Often, in such motion control systems, it would be desirable to determine whether a PICOMOTER™ is connected to a drive voltage source or power driver. For many reasons, a PICOMOTER™ may become disconnected from the power driver, such as by faulty wiring or disconnection of connectors. Because of the relatively high voltages involved in driving these types of piezoelectric actuators, faulty wiring and disconnected connectors may possess an inherent danger to users. Thus, it would be desirable for such motion control systems to alert a user and/or perform some other safety operation when a PICOMOTER™ is not connected to the power driver.

Additionally, in such motion control systems, it would be desirable to determine the type of PICOMOTER™ connected to the power driver. Certain types of PICOMOTERS™ have certain limitations, and should be operated in a particular manner. For example, a first type or standard PICOMOTER™ may be driven with a pulse rate that is much higher than the maximum pulse rate for a second type or tiny PICOMOTER™. If the pulse rate applied to the second type or tiny PICOMOTER™ significantly exceeds its maximum pulse rate, irreversible damage to the PICOMOTER™ may occur.

Thus, there is a need to detect the presence and type of capacitive loads, such as piezoelectric actuators and PICOMOTERS™, which may be coupled to a power driver.

SUMMARY

An aspect of the disclosure relates to a system for determining whether a capacitive load is connected to a power driver, and if connected, the type of capacitive load. Examples of capacitive loads include piezoelectric actuators and PICOMOTER™. Examples of different types of PICOMOTER™ include a standard PICOMOTER™ and a tiny PICOMOTER™. However, it shall be understood that other types of capacitive loads may be detected by the techniques described herein.

In summary, the system comprises a detection apparatus or circuit configured to measure a characteristic of the capacitive load in response to a drive voltage generated by the power driver. By measuring the characteristic of the capacitive load, the detection apparatus or circuit is able to determine whether the capacitive load is connected to the power driver, and if connected, the type of capacitive load.

In a more specific example, the detection apparatus is configured to measure the current, if any, flowing between the power driver and the capacitive load in response to a drive voltage generated by the power driver. Based on the measured current, the detection apparatus is able to determine whether a capacitive load is connected to the power driver, and if connected, the type of capacitive load.

In one embodiment, the detection circuit comprises a differential amplifier, a first window comparator, a second window comparator, a first register, a second register, and a microcontroller. In this embodiment, the detection circuit is able to determine two types of capacitive loads connected to the power driver by measuring a capacitance of the capacitive load. For example, the capacitance of the first type of capacitive load is greater than the capacitance of the second type of capacitive load.

The differential amplifier generates a current-related voltage based on current flowing between the power driver and the capacitive load in response to a drive voltage generated by the power driver. The differential amplifier generates the current-related voltage by sensing a voltage drop across a resistor coupled in series between the power driver and the capacitive load. The drive voltage may be configured as a pulse having a leading edge and a trailing edge, wherein one of the edges has a gradual slope and the other edge has a steep slope. Based on this drive voltage, the current-related voltage will exhibit a spike that is substantially coincidental with the steep edge of the drive voltage. The peak or magnitude of the spike depends on the capacitance of the capacitive load, and is used to determine what type of capacitive load is present, if any.

The first window comparator compares the peak of the current-related voltage to first upper and lower thresholds. The first upper threshold corresponds to when the steep slope pertains to the leading edge of the drive voltage, and the first lower threshold corresponds to when the steep slope pertains to the trailing edge of the drive voltage. If the peak of the current-related voltage exceeds the first upper threshold in the positive direction or exceeds the first lower threshold in the negative direction, the first window comparator generates a signal that causes the first register to output a high logic level signal; otherwise, the first register outputs a low logic level signal.

Similarly, the second window comparator compares the peak of the current-related voltage to second upper and lower thresholds. The second upper and lower thresholds have magnitudes or absolute values that are less than the first upper and lower thresholds. Similarly, the second upper threshold corresponds to when the steep slope pertains to the leading edge of the drive voltage, and the second lower threshold corresponds to when the steep slope pertains to the trailing edge of the drive voltage. If the peak of the current-related voltage exceeds the second upper threshold in the positive direction or exceeds the second negative threshold in the negative direction, the second window comparator generates a signal that causes the second register to output a high logic level signal; otherwise, the second register outputs a low logic level signal.

The microcontroller reads the outputs of the first and second registers to determine whether a capacitive load is connected to the power driver, and if connected, the type of capacitive load. For instance, if both registers output low logic levels, the microcontroller interprets this as no capacitive load connected to the power driver because the current failed to exceed any of the thresholds. If the first register outputs a low logic level and the second register outputs a high logic level, the microcontroller interprets this as the second type of capacitive load (e.g., the capacitive load with a lower capacitance) connected to the power driver because the current exceeds one of the second thresholds, but does not exceed one of the first thresholds. If both registers output high logic levels, the microcontroller interprets this as the first type of capacitive load (e.g., the capacitive load with a higher capacitance) connected to the power driver because the current exceeds one set of the first and second thresholds. The microcontroller may perform any number of operations based on the result of the measurement.

Another embodiment disclosed herein is similar to the aforementioned embodiment except that it is not limited to detecting two types of capacitive loads, but is configured for detecting N types of capacitive loads. Accordingly, this embodiment comprises a differential amplifier to generate a current-related voltage, N window comparators to compare the peak of the current-related voltage to N sets of upper and lower thresholds, N registers, and a microcontroller. Based on the word generated at the combined outputs of the registers, the microprocessor determines whether a capacitive load is connected to the power driver, and if connected, the type of capacitive load out of N types.

In yet another embodiment disclosed herein, the detection apparatus comprises a device to rectify or take the absolute value of the current-related voltage generated by a differential amplifier. A peak and hold amplifier is provided to hold the peak of the rectified current-related voltage until a reset signal is issued by a microcontroller. An analog-to-digital converter (ADC) is provided to generate a digital word indicative of the peak value held by the peak and hold amplifier. The microprocessor reads the digital word from the ADC, and determines whether a capacitive load is connected to the power driver, and if connected, the type of capacitive load based on the digital word. The microprocessor may employ a table to map the digital word to the type of capacitive load or to an entry indicating no capacitive load.

Other aspects, advantages and novel features of the disclosure will become apparent from the following detailed description of the invention when considered in conjunction with the accompanying drawings.

DETAILED DESCRIPTION OF THE EXEMPLARY EMBODIMENTS

Figure 1:
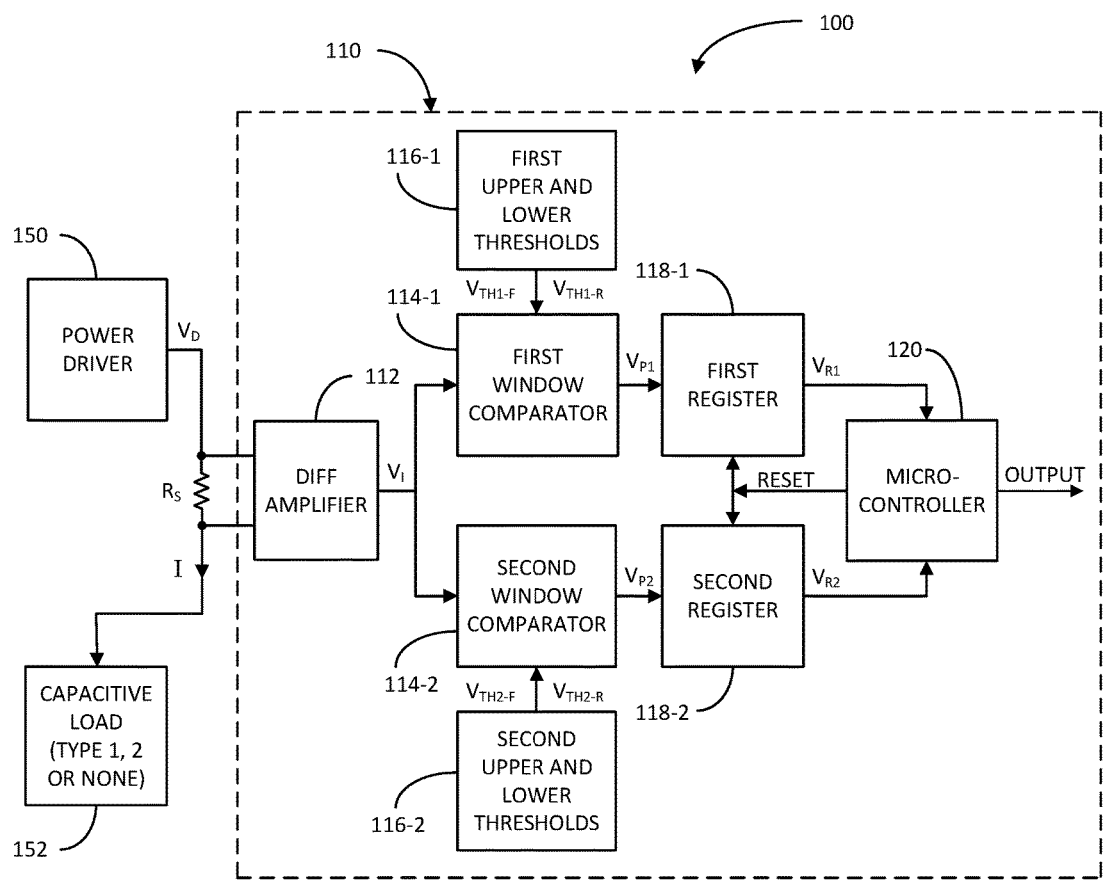
FIG. 1 illustrates a block diagram of an exemplary system for detecting the presence and type of capacitive load that may be connected to a power driver in accordance with an aspect of the disclosure.

FIG. 1 illustrates a block diagram of an exemplary system 100 for detecting the presence and type of capacitive load 152 that may be connected to a power driver 150 in accordance with an aspect of the disclosure. The capacitive load 152 may comprise any type of capacitive loads including different types of piezoelectric actuators and different types of PICOMOTERS™. In summary, the system 100 comprises a detection circuit 110 configured to sense the current I flowing between the power driver 150 and the capacitive load 152 by way of a resistor $R_S$ in response to a drive voltage $V_D$ generated by the power driver 150, and determine the type of capacitive load 152 or whether the capacitive load 152 is connected to the power driver 150 based on that measured current I.

In this example, there are two possible types of capacitive loads. For example, the two types of capacitive load may include a standard PICOMOTER™ and a tiny PICOMOTER™. More generically, the two types of capacitive loads may include a higher-capacitive load and a lower-capacitive load. However, it shall be understood that the detection circuit may be able to detect more than two types of capacitive loads, as will be discussed with reference to another exemplary embodiment described herein.

In particular, the detection circuit 110 comprises a differential amplifier 112, a first window comparator 114-1, a first upper and lower threshold generator 116-1, a second window comparator 114-2, and a second upper and lower threshold generator 116-2. Additionally, the detection circuit 110 comprises a first register 118-1, a second register 118-2, and a microcontroller 120.

The detection of the type or the presence of the capacitive load 152 operates as follows. The power driver 150 is operated to generate a drive voltage $V_D$. For example, the drive voltage $V_D$ may be in the form of a defined pulse or waveform. In response to the drive voltage $V_D$, a current I may be produced that flows between the power driver 150 and the capacitive load 152. If, for example, the capacitive load 152 is not present or is disconnected from the power driver 150 due to faulty wiring or other causes, no or little current I may be produced.

If, on the other hand, a capacitive load 152 is present, the current I generated may have a magnitude or a peak that is related to the capacitance of the capacitive load 152. For example, assuming that the capacitance of the first type of capacitive load (e.g., a standard PICOMOTER™) is greater than the capacitance of the second type of capacitive load (e.g., a tiny PICOMOTER™), the magnitude or peak of the current I produced will be greater for the first type of capacitive load than for the second type of capacitive load.

Additionally, the drive voltage $V_D$ may be configured to operate the capacitive load 152 in a certain manner, which results in a positive peak current I (e.g., a current flowing from the power driver 150 to the capacitive load 152), or operate the capacitive load 152 in another manner, which results in a negative peak current I (e.g., a current flowing from the capacitive load 152 to the power driver 150). This may be the case where the capacitive load 152 comprises a piezoelectric actuator or PICOMOTER™ that is operated to move in one direction (e.g., a forward or clockwise direction), which results in a negative peak current I, or operated to move in the opposite direction (e.g., a reverse or counter-clockwise direction), which results in a positive peak current I.

The differential amplifier 112 generates a voltage $V_I$ that is proportional or related to the current I by sensing the voltage drop across the current-sensing resistor $R_S$. The first window comparator 114-1 compares the current-related voltage $V_I$ to lower and upper thresholds $V_{TH1-F}$ and $V_{TH1-R}$. The lower threshold $V_{TH1-F}$ applies to when the capacitive load 152 is operated in a particular manner (e.g., moved in a forward or clockwise direction) that produces a negative peak current I, and the upper threshold $V_{TH1-R}$ applies to when the capacitive load 152 is operated in another manner (e.g., moved in a reverse or counter-clockwise direction) that produces a positive peak current I.

For instance, if the peak of the current-related voltage $V_I$ exceeds the lower threshold $V_{TH1-F}$ in the negative direction or exceeds the upper threshold $V_{TH1-R}$ in the positive direction, the first window comparator 114-1 generates a voltage $V_{P1}$ that causes the register 118-1 to produce an output signal $V_{R1}$ at a high logic level. Otherwise, if the peak of the current-related voltage $V_I$ does not exceed the lower threshold $V_{TH1-F}$ in the negative direction or does not exceed the upper threshold $V_{TH1-R}$ in the positive direction, the first window comparator 114-1 generates a voltage $V_{P1}$ that does not cause the register 118-1 to output $V_{R1}$ at the high logic level; and thus, the output signal $V_{R1}$ of the register 118-1 remains at a low logic level.

Similarly, the second window comparator 114-2 compares the current-related voltage $V_I$ to lower and upper thresholds $V_{TH2-F}$ and $V_{TH2-R}$. The lower threshold $V_{TH2-F}$ applies to when the capacitive load 152 is operated in a particular manner (e.g., moved in a forward or clockwise direction) that produces a negative peak current I, and the upper threshold $V_{TH2-R}$ applies to when the capacitive load 152 is operated in another manner (e.g., moved in a reverse or counter-clockwise direction) that produces a positive peak current I. The lower and upper thresholds $V_{TH2-F}$ and $V_{TH2-R}$ of the second window comparator 114-2 are smaller in magnitude than the lower and upper thresholds $V_{TH1-F}$ and $V_{TH1-R}$ of the first window comparator 114-1. This is because the thresholds $V_{TH2-F}$ and $V_{TH2-R}$ are used for detecting a type 2 capacitive load that has a smaller capacitance than the type 1 capacitive load.

Similarly, if the peak of the current-related voltage $V_I$ exceeds the lower threshold $V_{TH2-F}$ in the negative direction or exceeds the upper threshold $V_{TH2-R}$ in the positive direction, the second window comparator 114-2 generates a voltage $V_{P2}$ that causes the second register 118-2 to produce an output signal $V_{R2}$ at a high logic level. Otherwise, if the peak of the current-related voltage $V_I$ does not exceed the lower threshold $V_{TH2-F}$ in the negative direction or does not exceed the upper threshold $V_{TH2-R}$ in the positive direction, the second window comparator 114-2 generates a voltage $V_{P2}$ that does not cause the second register 118-2 to output $V_{R2}$ at a high logic level; and thus, the output signal $V_{R2}$ of the register 118-2 remains at a low logic level.

The respective output signals $V_{R1}$ and $V_{R2}$ of the registers 118-1 and registers 118-2 indicate whether a capacitive load is connected to the power driver 150 and if connected, the type of capacitive load 152. For instance, if the output signals $V_{R1}$ and $V_{R2}$ are both at low logic levels, this indicates that there is no capacitive load connected to the power driver 150. This is because the current I, as measured by the current-related voltage $V_I$, does not exceed either both thresholds $V_{TH1-F}$ and $V_{TH2-F}$ in the negative direction or both thresholds $V_{TH1-R}$ and $V_{TH2-R}$ in the positive direction. In other words, the current I is below what is expected for type 1 and type 2 capacitive loads; and thus, this implies the absence of a capacitive load connected to the power driver 150.

Considering another case, if the output signal $V_{R1}$ of the first register 118-1 is at a low logic level, and the output signal $V_{R2}$ of the second register 118-2 is at a high logic level, this indicates that a type 2 capacitive load (i.e., the load with lesser capacitance) is connected to the power driver 150. This is because the current I, as measured by the current-related voltage $V_I$, exceeds the threshold $V_{TH2-F}$ in the negative direction or the threshold $V_{TH2-R}$ in the positive direction, but does not exceed the threshold $V_{TH1-F}$ in the negative direction or the threshold $V_{TH1-R}$ in the positive direction. In other words, the current I is at or above what is expected for a type 2 capacitive load, but below what is expected for a type 1 capacitive load; and thus, this implies that a type 2 capacitive load is connected to the power driver 150.

Considering the last case, if the respective output signals $V_{R1}$ and $V_{R2}$ of the first and second registers 118-1 and 118-2 are both at high logic levels, this indicates that a type 1 capacitive load (i.e., the load with a greater capacitance) is connected to the power driver 150. This is because the current I, as measured by the current-related voltage $V_I$, exceeds either both thresholds $V_{TH1-F}$ and $V_{TH2-F}$ in the negative direction or both thresholds $V_{TH1-R}$ and $V_{TH2-R}$ in the positive direction. In other words, the current I is at or above what is expected for a type 1 capacitive load; and thus, this implies that a type 1 capacitive load is connected to the power driver 150.

The microcontroller 120 may read the outputs of the registers 118-1 and 118-2 at any time to ascertain whether there is a capacitive load 152 connected to the power driver 150, and if connected, the type of capacitive load. After reading the outputs of the registers 118-1 and 118-2, the microcontroller 120 may generate a reset signal to clear the first and second registers 118-1 and 118-2; or more specifically, to cause the outputs $V_{R1}$ and $V_{R2}$ of the registers 118-1 and 118-2 to be at low logic levels.

Based on the outcome of the aforementioned measurement, the microcontroller 120 may perform any defined operation. For example, in the case where the measurement indicates an absence of a capacitive load, the microcontroller 120 may inform a user by way of a user interface device (e.g., display, speaker, etc.) of the absence of the capacitive load. Alternatively, or in addition to, the microcontroller 120 may inhibit certain operations like, for example, the generation of the drive voltage $V_D$ by the power driver 150. Similarly, in response to the measurement indicating that a type 2 capacitive load is connected to the power driver 150, the microcontroller 120 may inhibit and/or allow certain operations. For example, if the type 2 capacitive load is a tiny PICOMOTER™ that can only be driven with a certain maximum pulse rate (e.g., a rate below the specified pulse rate for the standard PICOMOTER™), the microcontroller 120 may limit the pulse rate to the maximum pulse rate for the tiny PICOMOTER™. It shall be understood that the microcontroller 120 may perform any operation based on the results of the measurement. The microcontroller 120 may reset the registers 118-1 and 118-1 after each measurement by generating a reset signal. The reset signal causes the output signals $V_{R1}$ and $V_{R2}$ of the registers 118-1 and 118-2 to be at low logic levels.

As noted in FIG. 1, the detection circuit 110 may be separate from the power driver 150 and capacitive load 152. This facilitates the implementation of the detection circuit 110 in exiting systems that include a power driver 150 and a capacitive load 152. Often, in such systems, a resistor is coupled in series between the power driver 150 and the capacitive load 152 for current-limiting purpose or other purposes. Thus, in such cases, the differential amplifier 112 of the detection circuit 110 may be easily connected across such resistor in order to effectuate the measurement of the current and perform the detection of the presence and/or type of capacitive load.

Figure 2A:
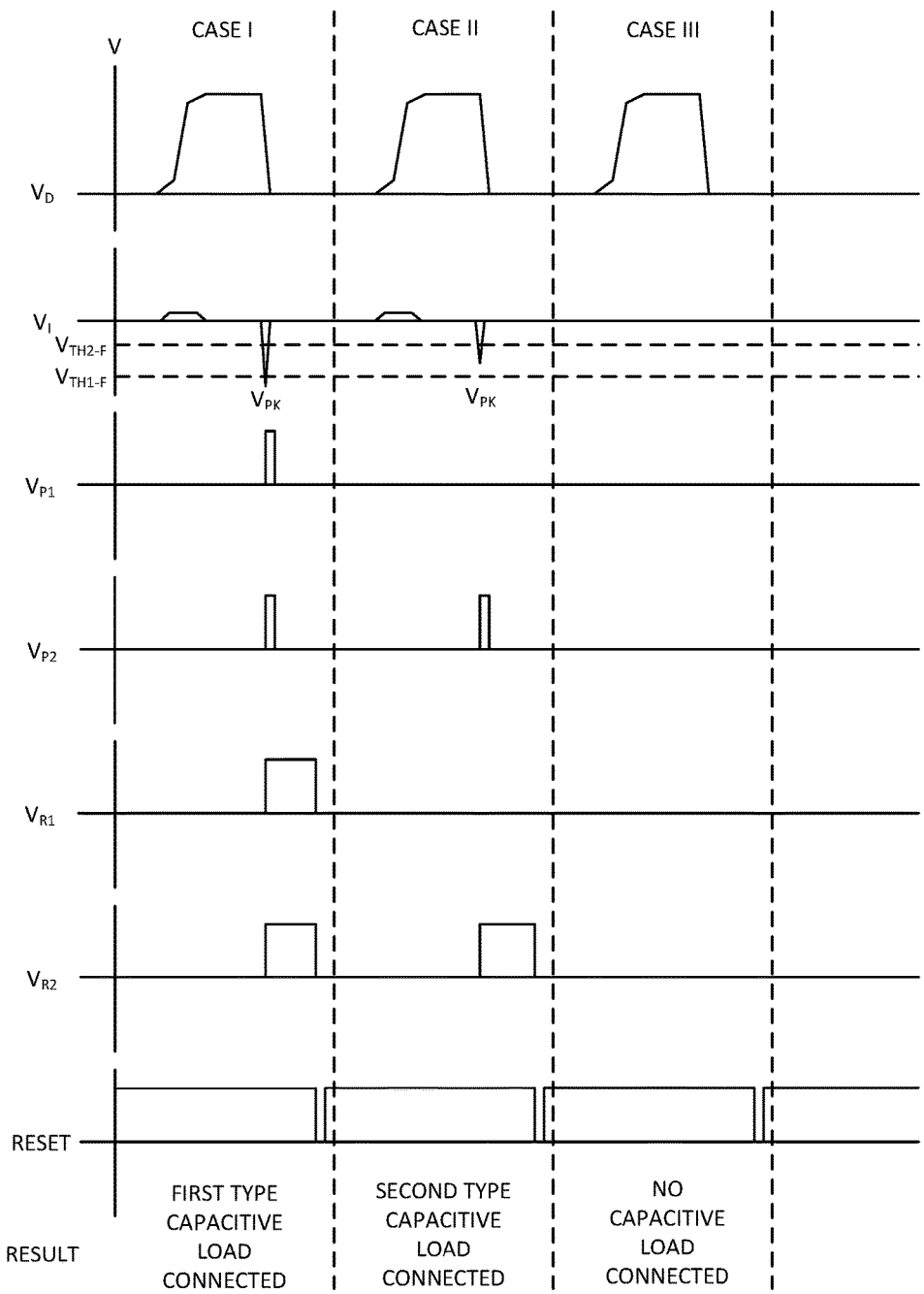
FIGS. 2A-2B illustrate timing diagrams associated with exemplary operation of the system of FIG. 1 in accordance with another aspect of the disclosure.

FIG. 2A illustrates a timing diagram associated with exemplary operation of the system 100 in accordance with another aspect of the disclosure. The timing diagram is used to summarize the operation discussed above when the capacitive load 152 is operated in a manner (e.g., moved in a forward or clockwise direction) that produces a negative peak current I. Additionally, the timing diagram addresses three cases: case I where a type 1 capacitive load is connected to the power driver; case II where a type 2 capacitive load is connected to the power driver; and case III where no capacitive load is connected to the power driver.

The x- or horizontal axis for each case represents time, and the y- or vertical axis represents the different voltages or signals associated with the operation of the detection circuit 110. These voltages or signals include, from ascending to descending order, the drive voltage $V_D$ generated by the power driver 150, the current-related voltage $V_I$ generated by the differential amplifier 112, the voltage $V_{P1}$ generated by the first window comparator 114-1, the voltage $V_{P2}$ generated by the second window comparator 114-2, the signal $V_{R1}$ generated by the first register 118-1, the signal $V_{R2}$ generated by the second register 118-2, and the reset signal generated by the microcontroller 120.

Considering case I where a type 1 capacitive load is connected to the power driver 150, the drive voltage $V_D$ shown may be configured to drive a PICOMOTER™ in a first direction (e.g., in a forward or clockwise direction) using the principle of stick and slip or static or dynamic friction. The leading edge of the drive voltage $V_D$ has a gradual rising slope in order to expand a piezoelectric material in a slow manner, which allows the piezoelectric material to rotate a wheel in contact therewith in one direction due to greater static friction. The trailing edge of the drive voltage $V_D$ has a fast falling slope in order to contract the piezoelectric material in a fast manner to cause slippage of the piezoelectric material along the wheel due to the lesser dynamic friction. Thus, using this waveform $V_D$, the wheel turns in one direction and does not turn in the opposite direction.

The current I produced in response to this drive voltage $V_D$, as indicated by the current-related voltage $V_I$, has a small positive rise/fall substantially coincidental with the leading edge of the drive voltage $V_D$, and a large negative spike substantially coincidental with the trailing edge of the drive voltage $V_D$. In the example of case I, the negative peak $V_{PK}$ exceeds both lower thresholds $V_{TH1-F}$ and $V_{TH2-F}$ of the first and second window comparators 114-1 and 114-2, respectively. This causes both the first and second window comparators 114-1 and 114-2 to generate voltages $V_{P1}$ and $V_{P2}$ in the form of positive pulses substantially coincidental with the negative peak $V_{PK}$ of the current-related voltage $V_I$.

The pulses generated by the first and second window comparators 114-1 and 114-2 cause the first and second registers 118-1 and 118-2 to generate voltages $V_{R1}$ and $V_{R2}$ at high logic levels. As previously discussed, the outputs of the registers 118-1 and 118-2 at high logic levels indicate that a type 1 capacitive load (e.g., a standard PICOMOTER™) is connected to the power driver 150. The microcontroller 120 then reads the outputs of the registers 118-1 and 118-2 and then issues a reset (e.g., an inverted pulse) to both registers to bring their outputs to low logic levels. The microcontroller 120 may then perform one or more functions based on the detection of the type 1 capacitive load connected to the power driver 150.

Considering case II where a type 2 capacitive load is connected to the power driver 150, the same or similar drive voltage $V_D$ is generated by the power driver 150. In response to the drive voltage $V_D$, the current-related voltage $V_I$ generated has a positive rise/fall substantially coincidental with the leading edge of the drive voltage $V_D$, and a negative peak $V_{PK}$ substantially coincidental with the trailing edge of the drive voltage $V_D$. In this case, the negative peak $V_{PK}$ does not exceed the threshold $V_{TH1-F}$ in the negative direction, but exceeds the threshold $V_{TH2-F}$ in the negative direction. As a result, the first window comparator 118-1 does not generate a signal $V_{P1}$ with a pulse, but the second window comparator 118-2 does generate a signal $V_{P2}$ with a pulse substantially coincidental with the negative peak $V_{PK}$ of the current-related voltage $V_I$.

Because of the absence of a pulse in the signal $V_{P1}$, the first register 118-1 continues to generate the signal $V_{R1}$ at a low logic level. However, due to a pulse in the signal $V_{P2}$, the second register 118-2 generates the signal $V_{R2}$ at a high logic level. As previously discussed, the outputs of the registers 118-1 and 118-2 being at low and high logic levels, respectively, indicate that a type 2 capacitive load (e.g., a tiny PICOMOTER™) is connected to the power driver 150. The microcontroller 120 then reads the outputs of the registers 118-1 and 118-2 and issues a reset (e.g., an inverted pulse) to both registers to ensure that their outputs are both at low logic levels. The microcontroller 120 may then perform one or more functions based on the detection of a type 2 capacitive load connected to the power driver 150.

Finally, considering case III where there is no capacitive load connected to the power driver 150, the same or similar drive voltage $V_D$ is generated by the power driver 150. Since there is no load, no current I is generated in response to the drive voltage $V_D$. As a result, the current-related voltage $V_I$ remains at substantially zero (0) Volt, and accordingly, does not exceed both thresholds $V_{TH1-F}$ and $V_{TH2-F}$. As a result, the first and second window comparators 118-1 and 118-2 do not generate signals $V_{P1}$ and $V_{P2}$ with pulses. Because of an absence of pulses in the signals $V_{P1}$ and $V_{P2}$, the first and second register 118-1 and 118-2 continue to generate signals $V_R1$ and $V_R2$ at low logic levels. As previously discussed, the outputs of the registers 118-1 and 118-2 being at low logic levels indicate the absence of a capacitive load connected to the power driver 150. The microcontroller 120 then reads the outputs of the registers 118-1 and 118-2 and issues a reset (e.g., an inverted pulse) to both registers to ensure that their outputs are at low logic levels. The microcontroller 120 may then perform one or more functions based on the detection of no capacitive load connected to the power driver 150.

Figure 2B:
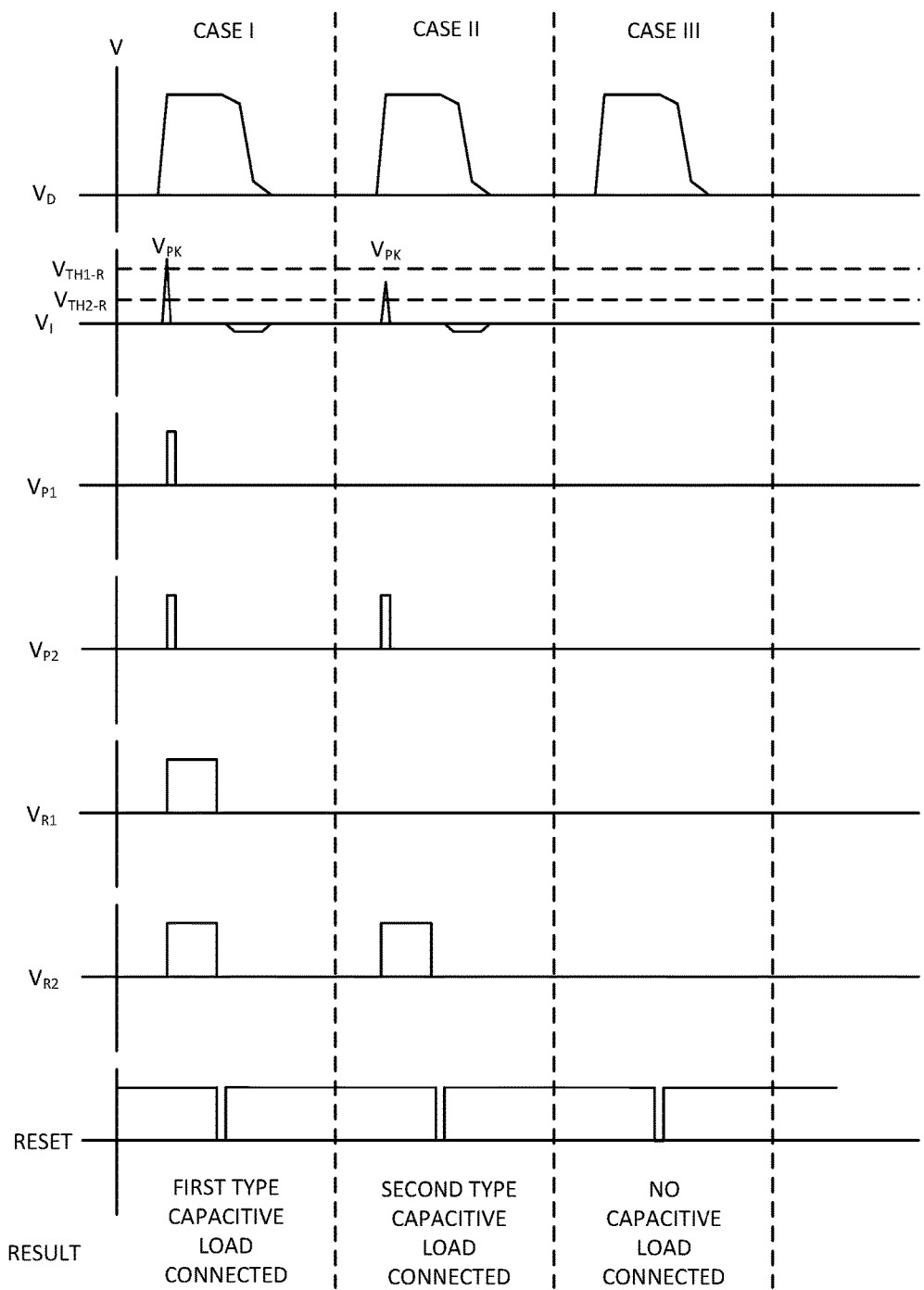

FIG. 2B illustrates another timing diagram associated with exemplary operation of the system 100 in accordance with another aspect of the disclosure. The timing diagram is similar to the timing diagram of FIG. 2A, except that the capacitive load 152 (e.g., a piezoelectric actuator or PICOMOTER™) is driven in the opposite direction (e.g., in the reverse or counter-clockwise direction). In particular, the waveform of the drive voltage $V_D$ has a leading edge that rises relatively fast and a trailing edge that falls relatively slow. Thus, in the case of a PICOMOTER™ as the capacitive load 152, the PICOMOTER™ does not rotate during the leading edge due to slippage or lower dynamic friction, but rotates during the trailing edge due to the higher static friction. Nonetheless, the operation of the detection circuit 110 operates in a similar manner.

Considering case I where a type 1 capacitive load 152 is connected to the power driver 150, the current I, as measured by the current-related voltage $V_I$, has a positive peak $V_{PK}$ substantially coincidental with the leading edge of the drive voltage $V_D$, and a small negative fall/rise substantially coincidental with the trailing edge of the drive voltage $V_D$. Since the positive peak $V_{PK}$ of the current-related voltage $V_I$ is above both thresholds $V_{TH1-R}$ and $V_{TH2-R}$, both first and second window comparators 114-1 and 114-2 generate signals $V_{P1}$ and $V_{P2}$ with pulses substantially coincidental with the peak $V_{PK}$ of the current-related voltage $V_I$. In response to the pulses generated by the first and second comparators 114-1 and 114-2, the first and second registers 118-1 and 118-2 generate signals $V_{R1}$ and $V_{R2}$ at high logic levels, respectively. As previously discussed, the output signals $V_{R1}$ and $V_{R2}$ of the registers being at high logic levels indicate that a type 1 capacitive load 152 is connected to the power driver 150. The microcontroller 120 reads the outputs of the registers, and performs any number of operations based on a type 1 capacitive load being detected. The microcontroller 120 also issues a reset signal (e.g., an inverted pulse) to reset the registers 118-1 and 118-2 to ensure that they output low logic levels.

Considering case II where a type 2 capacitive load 152 is connected to the power driver 150, the current I, as measured by the current-related voltage $V_I$, has a positive peak $V_{PK}$ substantially coincidental with the leading edge of the drive voltage $V_D$, and a small negative fall/rise substantially coincidental with the trailing edge of the drive voltage $V_D$. In this case, the positive peak $V_{PK}$ of the current-related voltage $V_I$ is above threshold $V_{TH2-R}$, but below threshold $V_{TH1-R}$. Accordingly, the first window comparator 114-1 does not generate a signal $V_{P1}$ with a pulse, but the second window comparator generates a signal $V_{P2}$ with a pulse substantially coincidental with the peak $V_{PK}$ of the current-related voltage $V_I$. In response to the pulse generated by the second window comparator 114-2, the second register 118-2 generates the signal $V_{R2}$ at a high logic level. However, the output signal $V_{R1}$ of the first register 118-1 remains at a low logic level due to a lack of pulse from the first window comparator 114-1. As previously discussed, the output signals $V_{R1}$ and $V_{R2}$ of the registers being at low and high logic levels respectively, indicate that a type 2 capacitive load 152 is connected to the power driver 150. The microcontroller 120 reads the outputs of the registers, and performs any number of operations based on a type 2 capacitive load being detected. The microcontroller 120 also issues a reset signal (e.g., an inverted pulse) to reset the registers 118-1 and 118-2 to ensure that they output low logic levels.

Considering case III where no capacitive load 152 is connected to the power driver 150, the current I, as measured by the current-related voltage $V_I$, is substantially zero (0), and accordingly, does not exceed both thresholds $V_{TH1-R}$ and $V_{TH2-R}$. Thus, the first and second window comparators 114-1 and 114-2 generate signals $V_{P1}$ and $V_{P2}$ without pulses. As a result, the signals $V_{R1}$ and $V_{R2}$ of the first and second registers 118-1 and 118-2 remain at low logic levels. As previously discussed, the output signals $V_{R1}$ and $V_{R2}$ of the registers being at low logic levels indicate that no capacitive load 152 is connected to the power driver 150. The microcontroller 120 reads the outputs of the registers, and performs any number of operations based on detecting no capacitive load. The microcontroller 120 then issues a reset signal (e.g., an inverted pulse) to reset the registers 118-1 and 118-2 to ensure that they output low logic levels.

Figure 3:
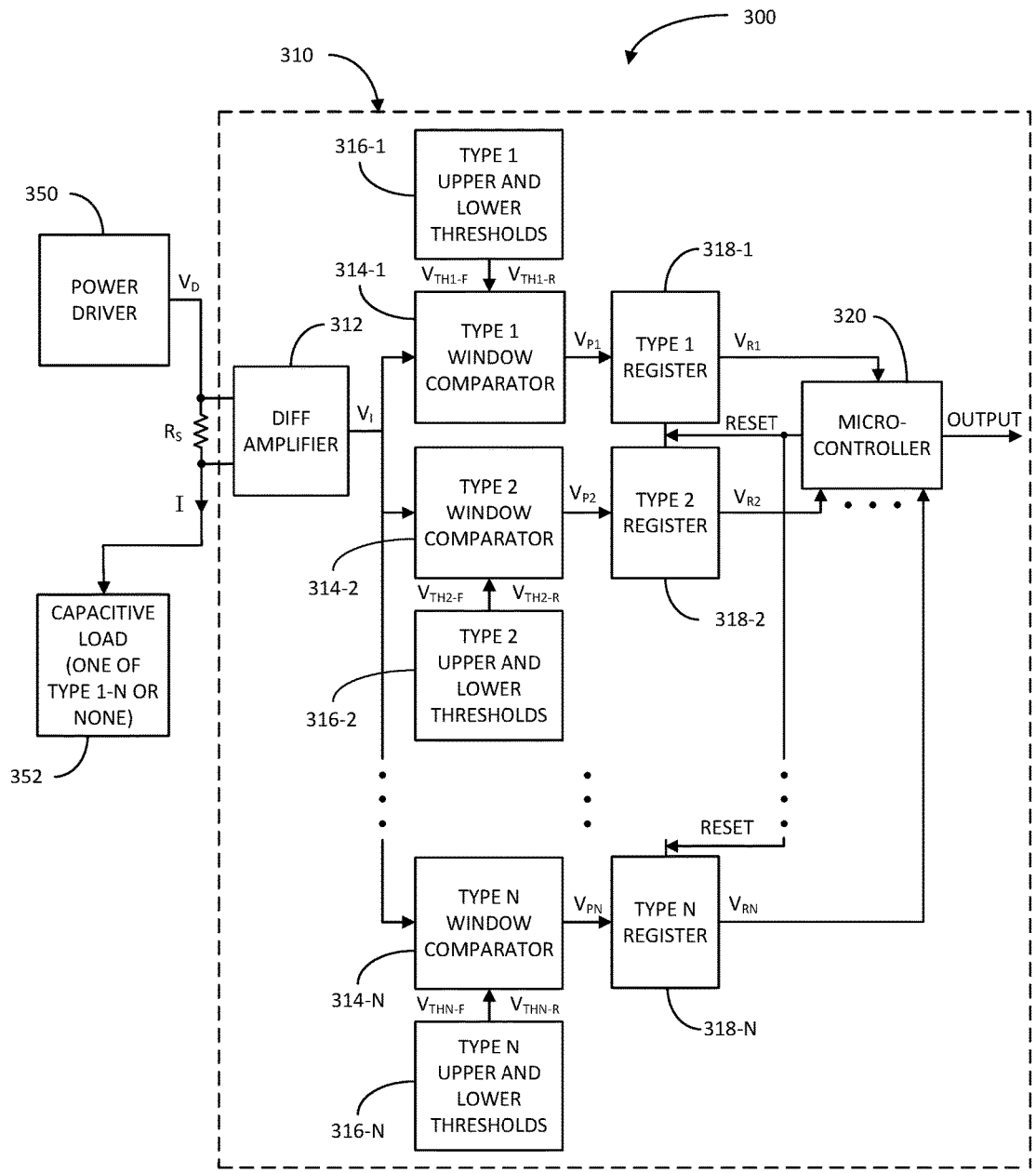
FIG. 3 illustrates a block diagram of another exemplary system for detecting the presence and type of capacitive load that may be connected to a power driver in accordance with another aspect of the disclosure.

FIG. 3 illustrates a block diagram of another exemplary system 300 for detecting the presence and type of capacitive load 352 that may be connected to a power driver 350 in accordance with another aspect of the disclosure. The system 300 is similar to the system 100, except that it comprises a detection circuit 310 that is able to detect N types of capacitive loads, instead of being limited to detecting two types of capacitive loads as in detection circuit 110. However, as discussed below, the principle of operations of detection circuit 310 is essentially the same as that of detection circuit 110.

In particular, the detection circuit 310 comprises a differential amplifier 312, N window comparators 314-1, 314-2 to 314-N, N threshold generators 316-1, 316-2 to 316-N, N registers 318-1, 318-2 to 318-N, and a microcontroller 320. The differential amplifier 312 generates a current-related voltage $V_I$ that is proportional or related to the current I produced in response to a drive voltage $V_D$ generated by the power driver 350 by sensing the voltage drop across a current sensing resistor $R_S$. The window comparators 314-1 to 314-N generate signals $V_{P1}$ to $V_{PN}$ with pulses in response to the current-related voltage $V_I$ exceeding the upper thresholds $V_{TH1-R}$ to $V_{THN-R}$ in the positive direction, or the lower thresholds $V_{TH1-F}$ to $V_{THN-F}$ in the negative direction, respectively.

In response to the signals $V_{P1}$ and $V_{PN}$ having pulses or lack of pulses, the registers 318-1 to 318-N generates signals $V_{R1}$ to $V_{RN}$ at high logic levels or low logic levels, respectively. The combined digital word generated by the registers 318-1 to 318-N indicates the type of capacitive load 352 connected to the power driver 350 or whether a capacitive load 152 is connected to the power driver 350.

Considering some examples, if the signals $V_{R1}$ to $V_{RN}$ are all at high logic levels, then a type 1 capacitive load 352 is connected to the power driver 350. If signal $V_{R1}$ is at a low logic level and the remaining signals $V_{R2}$ to $V_{RN}$ are at high logic levels, then a type 2 capacitive load 352 is connected to the power driver 350. If the signals $V_{R1}$ to $V_{RN-1}$ are all at low logic levels and signal $V_{RN}$ is at a high logic level, then a type N capacitive load 352 is connected to the power driver 350. If the signals $V_{R1}$ to $V_{RN}$ are all at low logic levels, then no capacitive load is connected to the power driver 350. The microcontroller 320 reads the outputs of the registers 318-1 to 318-N, and performs any number of operations based on which type of capacitive load 352 is connected to the power driver 350 or an absence of a capacitive load connected to the power driver 350.

Figure 4A:
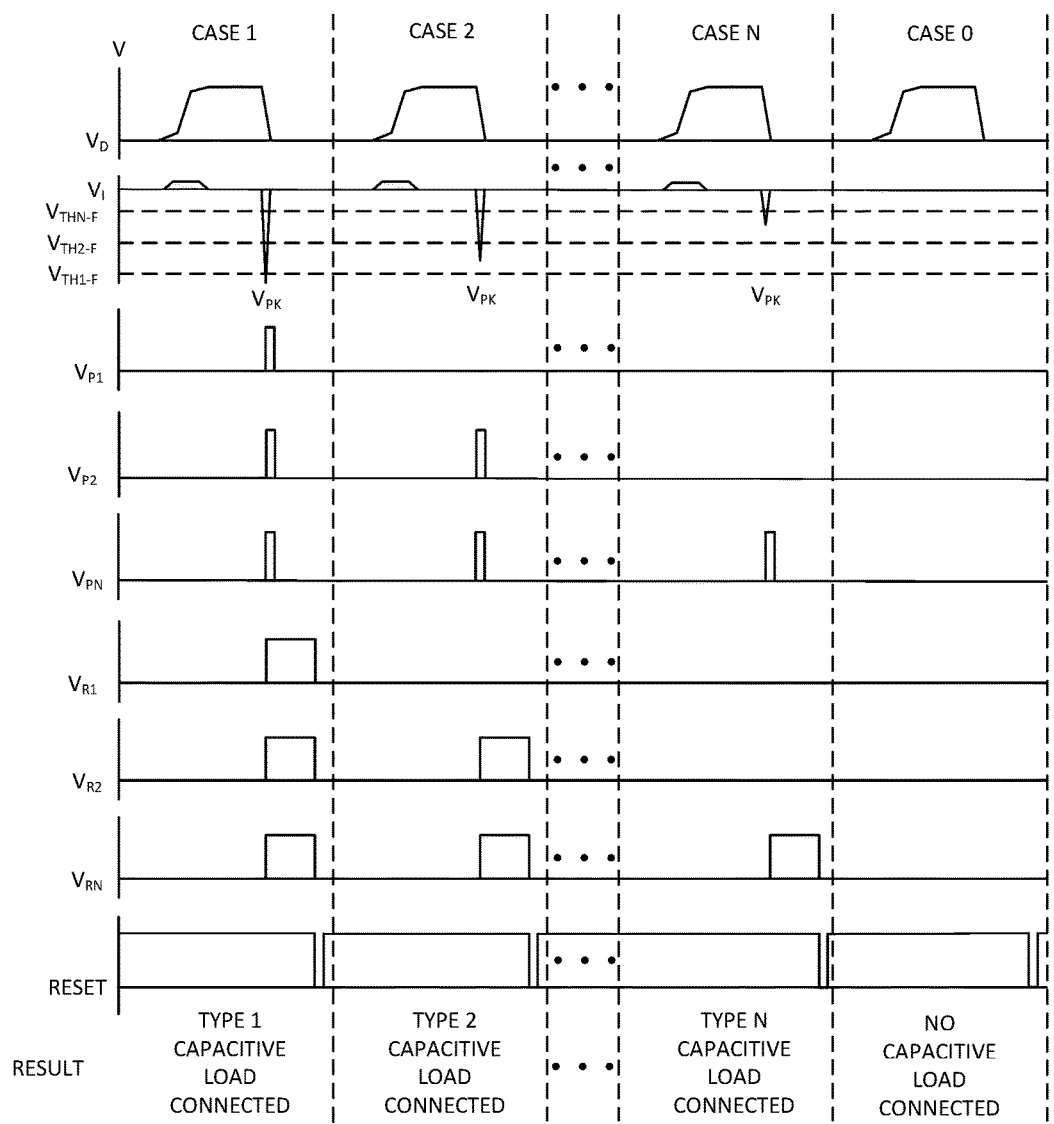
FIGS. 4A-4B illustrate timing diagrams associated with exemplary operation of the system of FIG. 3 in accordance with another aspect of the disclosure.
Figure 4B:
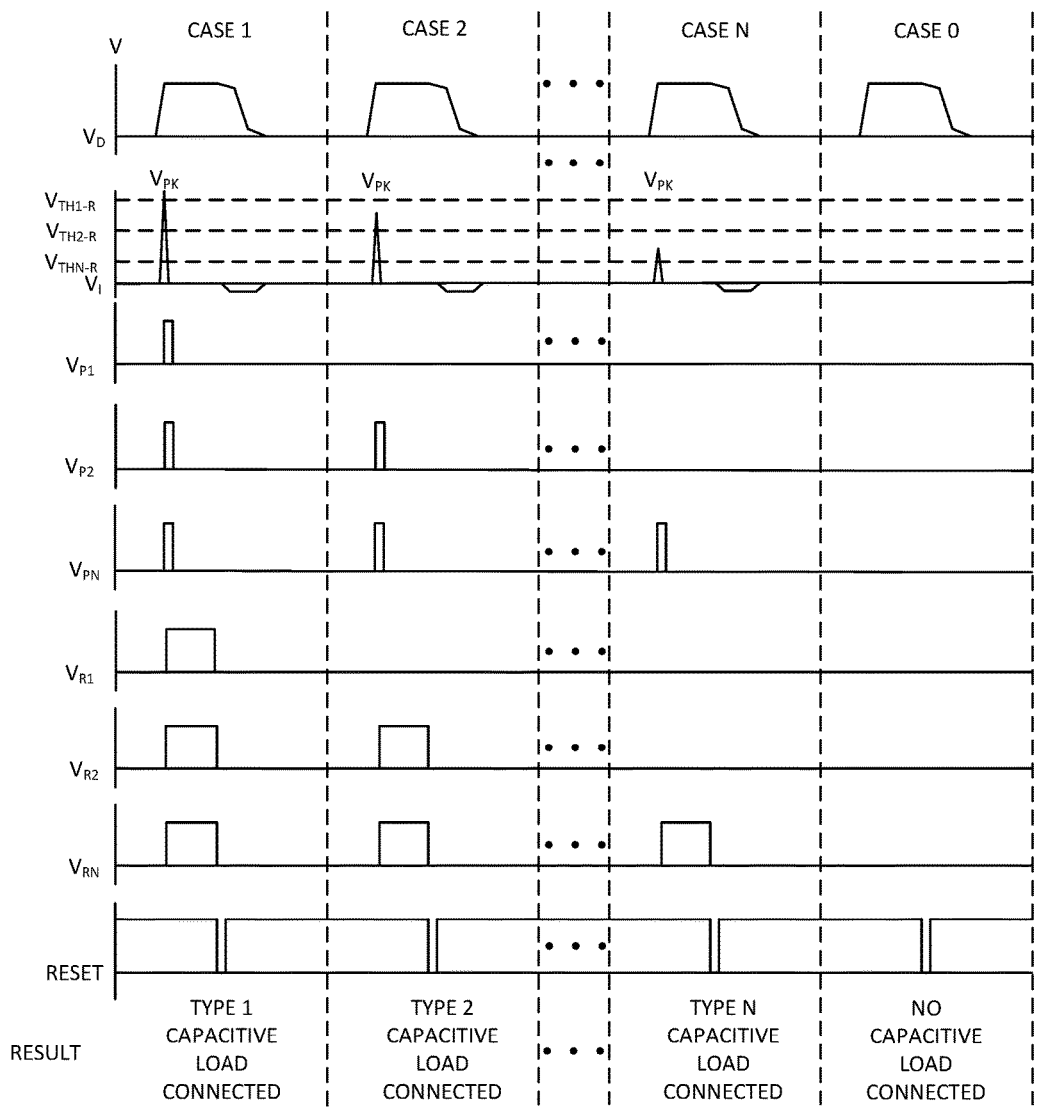

FIGS. 4A-4B illustrate timing diagrams associated with exemplary operation of the system 300 in accordance with another aspect of the disclosure. The timing diagrams are similar to the timing diagrams of FIGS. 2A-2B, respectively, except that the instant timing diagrams are for N+1 cases, rather than three (3) cases. Similar to FIGS. 2A-2B, the timing diagram of FIG. 4A deals with the capacitive load 352 operated in a first manner (e.g., moving it in a forward or clockwise direction), and the timing diagram of FIG. 4B deals with the capacitive load 352 operated in a second manner (e.g., moving it in a reverse or counter-clockwise direction).

Summarizing the timing diagrams of FIG. 4A-4B, case 1 deals with a type 1 capacitive load 352 (the load with the highest capacitance) connected to the power driver 350. In such a case, the current-related voltage $V_I$ has a negative peak coincidental with the trailing edge of the driving voltage $V_D$ and that exceeds all of the thresholds $V_{TH1-F}$ to $V_{THN-F}$ in the negative direction. This results in all of the window comparators 314-1 to 314-N generating signals $V_{P1}$ to $V_{PN}$ with pulses. The pulses cause the registers 318-1 to 318-N to produce signals $V_{R1}$ to $V_{RN}$ at high logic levels, respectively. The microprocessor 320 interprets the high logic levels at the outputs of the registers 318-1 to 318-N as a type 1 capacitive load 352 connected to the power driver 350. Once the outputs of the registers 318-1 to 318-N are read, the microprocessor 320 issues a reset (e.g., an inverted pulse) to reset the registers to ensure that they output signals $V_{R1}$ to $V_{RN}$ at low logic levels. The microcontroller 320 then performs any number of operations based on detecting that the type 1 capacitive load 352 is connected to the power driver 350. The other cases operate in a similar manner as indicated in the timing diagrams.

Figure 5A:
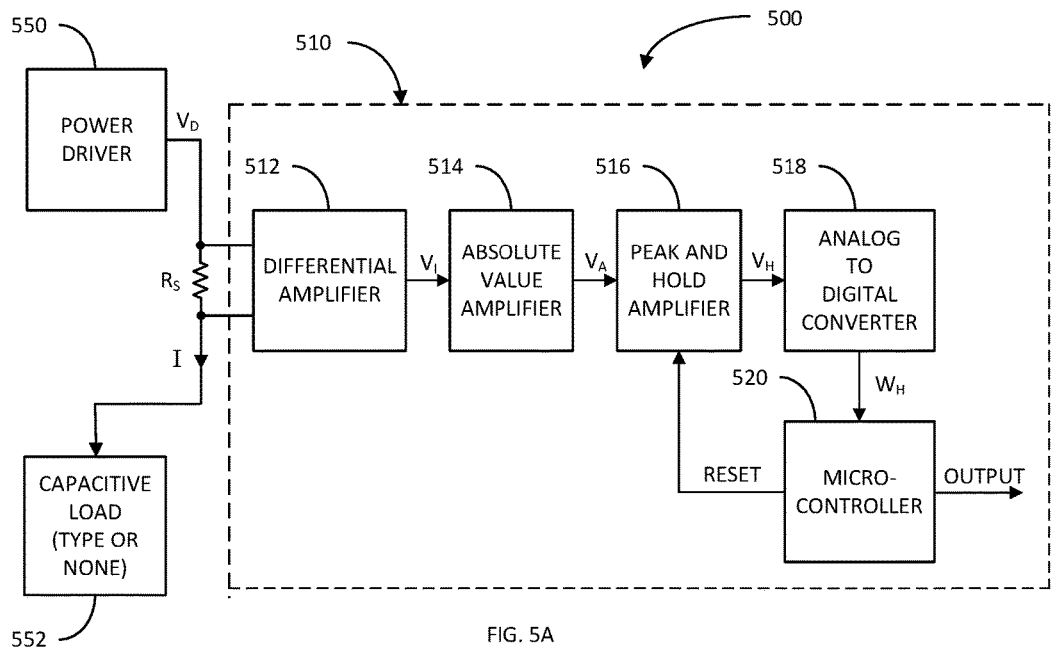
FIG. 5A illustrates a block diagram of yet another exemplary system for detecting the presence and type of capacitive load that may be connected to a power driver in accordance with another aspect of the disclosure.

FIG. 5A illustrates a block diagram of yet another exemplary system 500 for detecting the presence and type of capacitive load 552 connected to a power driver 550 in accordance with another aspect of the disclosure. In summary, the system 500 comprises a detection circuit 510 that rectifies or generates the absolute value of the current-related threshold $V_I$ to eliminate having two values for consideration. The detection circuit 510 includes a peak and hold device to generate an output indicative of the peak current, and an analog-to-digital converter (ADC) to generate a digital word indicative of the peak current. Based on the digital word, a microprocessor determine whether a capacitive load is connected to the power driver and, if connected, the type of capacitive load.

In particular, the detection circuit 510 comprises a differential amplifier 512, an absolute value amplifier 514, a peak and hold amplifier 516, an analog-to-digital converter (ADC) 518, and a microcontroller 520. The differential amplifier 512 generates a current-related voltage $V_I$ based on the current I flowing between the power driver 550 and the capacitive load 552 by sensing the voltage across the current-sensing resistor $R_S$. The absolute value amplifier 514 rectifies the current-related voltage $V_I$ in order to generate an absolute-value or rectified current-related voltage $V_A$.

The peak and hold amplifier 516 detects the peak of the rectified current-related voltage $V_A$ and generates a signal $V_H$ with a constant amplitude at the peak value. The ADC 518 generates a digital word $W_H$ indicative of the amplitude of the signal $V_H$ from the peak and hold amplifier 516. The microcontroller 520 receives the digital word $W_H$ from the ADC 518, and determines the presence and the type of capacitive load 352 based on the digital word $W_H$. Once the microcontroller 520 has performed the measurement, it sends a reset signal to the peak and hold amplifier 516 to cause the signal $V_H$ to be at substantially zero (0) Volt. The magnitude of the digital word $W_H$ is a function of the current I. The microcontroller 520 may use a table to map the digital word $W_H$ to the type of capacitive load 552 or to an entry indicating an absence of the capacitive load 552.

Figure 5B:
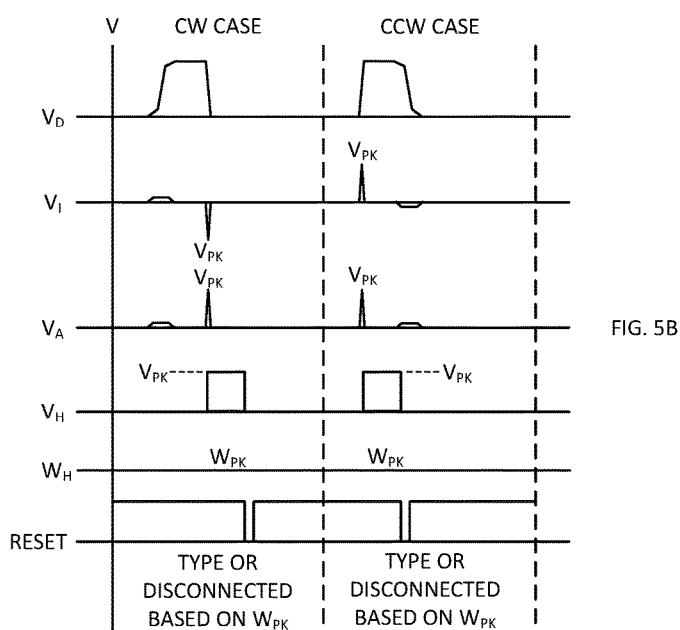
FIG. 5B illustrates a timing diagram associated with exemplary operation of the system of FIG. 5A in accordance with another aspect of the disclosure.

FIG. 5B illustrates a timing diagram associated with exemplary operation of the system 500 in accordance with another aspect of the disclosure. In this example, the capacitive load 552 may comprise a PICOMOTER™ configured to rotate in a clockwise (CW) manner or a counter-clockwise (CCW) manner. However, as frequently mentioned herein, the capacitive load 552 may comprise any type of capacitive load including other types of piezoelectric actuators and other types of devices. The timing diagram is similar to the previously-discussed timing diagrams, and depicts two cases: (1) the CW case where the PICOMOTER™ is operated to rotate in a clockwise manner; and (2) the CCW case where the PICOMOTER™ is operated to rotate in a counter-clockwise manner.

Considering the CW case, a drive voltage $V_D$ is generated by the power driver 550. The drive voltage $V_D$ has a relatively slow rising leading edge to cause the PICOMOTER™ to rotate in a clockwise manner, and has a relatively fast falling trailing edge to prevent the rotation of the PICOMOTER™ in a counter-clockwise manner. In response to the drive voltage $V_D$, the current I, as indicated by the current-related voltage $V_I$ generated by the differential amplifier 512, has a small positive rise/fall substantially coincidental with the leading edge of the drive voltage $V_D$, and a negative peak substantially coincidental with the trailing edge of the drive voltage $V_D$.

The absolute value amplifier 514 rectifies the current-related voltage $V_I$ to generate a rectified voltage $V_A$ to invert the negative peak into a positive peak $V_{PK}$. The peak and hold amplifier 516 detects the positive peak $V_{PK}$ of the rectified voltage $V_A$ and generates a constant amplitude signal $V_H$ at the peak value. The ADC 518 generates a digital word $W_H$ with a value $W_{PK}$ (related to the amplitude $V_{PK}$ of the signal $V_D$. The microcontroller 520 reads the value $W_{PK}$ (to determine the type of PICOMOTER™, or more generally, the type of capacitive load 552 connected to the power driver 550 or whether there is a PICOMOTER™ or capacitive load connected to the power driver 550. The microcontroller 520 then generates a reset signal (e.g., an inverted pulse) to reset the peak and hold amplifier 516 so that it generates an inactive output (e.g., zero (0) Volt). Based on the determination, the microcontroller 520 may perform any number of operations.

Considering the CCW case, a drive voltage $V_D$ is generated by the power driver 550. The drive voltage $V_D$ has a relatively fast rising leading edge to prevent the PICOMOTER™ from rotating in a clockwise manner, and has a relatively slow falling trailing edge to cause the PICOMOTER™ to rotate in a counter-clockwise manner. In response to the drive voltage $V_D$, the current I, as indicated by the current-related voltage $V_I$ generated by the differential amplifier 512, has a positive peak substantially coincidental with the leading edge of the drive voltage $V_D$, and a small negative fall/rise substantially coincidental with the trailing edge of the drive voltage $V_D$.

The absolute value amplifier 514 rectifies the current-related voltage $V_I$ to generate a rectified voltage $V_A$. In this case, the signal of interest, the positive peak voltage, is already positive. The peak and hold amplifier 516 detects the peak $V_{PK}$ of the rectified voltage $V_A$ and generates a constant amplitude signal $V_H$ at the peak value. The ADC 518 generates a digital word $W_H$ with a value $W_{PK}$ related to the amplitude $V_{PK}$ of the signal $V_H$. The microcontroller 520 reads the value $W_{PK}$ to determine the type of PICOMOTER™ or more generally, the type of capacitive load 552 connected to the power driver 550 or whether there is PICOMOTER™ or capacitive load is connected to the power driver 550. The microcontroller 520 then generates a reset signal (e.g., an inverted pulse) to reset the peak and hold amplifier 516 so that it generates an inactive output (e.g., zero (0) Volt). Based on the determination, the microcontroller 520 may perform any number of operations.

Figure 6:
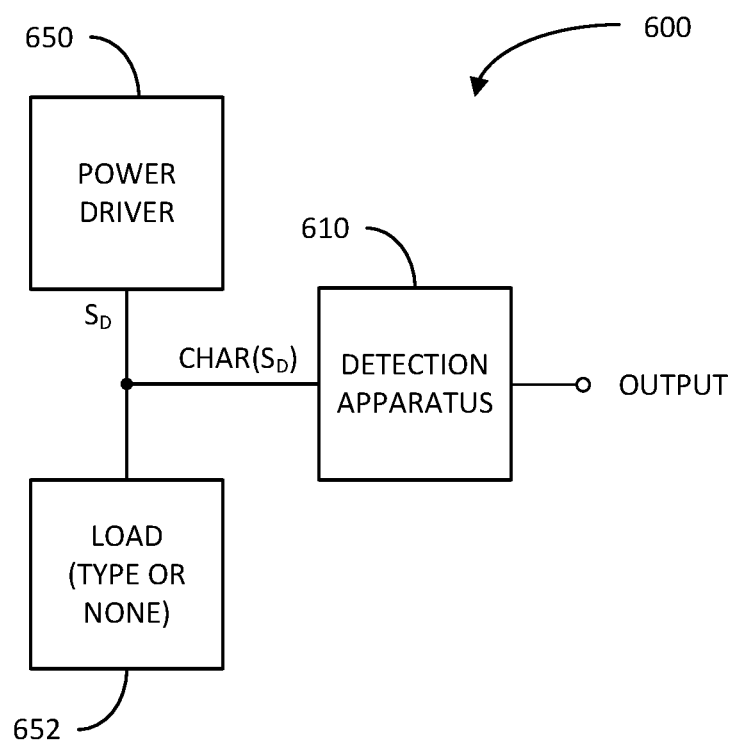
FIG. 6 illustrates a block diagram of still another exemplary system for detecting the presence and type of capacitive load that may be connected to a power driver in accordance with another aspect of the disclosure.

FIG. 6 illustrates a block diagram of still another exemplary system 600 for detecting the presence and type of load 652 that may be connected to a power driver 650 in accordance with another aspect of the disclosure. The discussion of the system 600 summarizes the principles upon which all the previous embodiments operate. The system 600 comprises a power driver 650, a load 652 (if any) coupled to the power driver 650, and a detection apparatus 610.

The detection principle operates as follows. The power driver 650 is operated to generate a drive signal $S_D$, which could be a current or a voltage. In response to the drive signal $S_D$, the detection apparatus 610 measures a characteristic of the load 652 in response to the drive signal $S_D$ by sensing a parameter responsive to the drive signal $S_D$. The characteristic of the load 652 may relate to the capacitance of the load. Based on the sensed parameter or characteristic of the load 652, the detection apparatus 610 determines whether a load is in fact connected to the power driver 650, and if connected, the type of load connected to the power driver 650. The detection apparatus 610 may then perform any number of operations based on its determination.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A system, comprising:
   a piezoelectric actuator comprising:
      a piezoelectric material configured to expand or contract in response to a drive voltage; and
      a rotor frictionally coupled to the piezoelectric material;
   a power diver configured to generate the drive voltage, wherein the drive voltage comprises a pulse with a first edge and a second edge, wherein a slope of the first edge is greater than a slope of the second edge to cause the rotor to rotate clockwise or counter-clockwise due to a coefficient of friction between the piezoelectric material and the rotor during the second edge being greater than a coefficient of friction between the piezoelectric material and the rotor during the first edge;
   an electrical connection configured to electrically couple the power driver to the piezoelectric actuator; and
   a detection circuit configured to determine whether the piezoelectric actuator is connected to the power driver by sensing a parameter associated with the electrical connection, and if connected, the type of the piezoelectric actuator connected to the power driver based on a measured characteristic of the piezoelectric actuator in response to the drive voltage.

2. The system of claim 1, wherein the measured characteristic comprises a capacitance of the piezoelectric actuator.

3. The system of claim 2, wherein the detection circuit is configured to measure the capacitance of the piezoelectric actuator by sensing a current flow between the power driver and the piezoelectric actuator.

4. The system of claim 3, wherein the detection circuit is configured to determine the type of the piezoelectric actuator connected to the power driver based on a positive or negative peak of the sensed current flowing between the power driver and the piezoelectric actuator.

5. The system of claim 1, wherein the measured characteristic is based only on the first edge among the first and second edges of the pulse.

6. The system of claim 5, wherein the measured characteristic comprises a capacitance of the piezoelectric actuator.

7. The system of claim 5, wherein the slope of the first edge comprises a negative slope.

8. The system of claim 5, wherein the slope of the first edge comprises a positive slope.

9. The system of claim 1, wherein the detection circuit comprises:
   a differential amplifier configured to generate a current-related voltage based on current flowing between the power driver and the piezoelectric actuator via the electrical connection in response to the drive voltage;
   a first circuit configured to produce a first logic voltage, wherein the first logic voltage is at an asserted level in response to the current-related voltage being above a first positive threshold if the first edge has a positive slope or below a first negative threshold if the first edge has a negative slope, and at a de-asserted level in response to the current-related voltage being below the first positive threshold if the first edge has a positive slope or above the first negative threshold if the first edge has a negative slope; and
   a second circuit configured to produce a second logic signal, wherein the second logic voltage is at an asserted level in response to the current-related voltage being above a second positive threshold or below a second negative threshold, and at a de-asserted level in response to the current-related voltage being below the second positive threshold or above the second negative threshold.

10. The system of claim 9, wherein the first or second logic voltage is asserted in response to the current-related voltage being respectively above the first or second positive threshold in further response to the first edge having a positive slope, and wherein the first or second logic voltage is asserted in response to the current-related voltage being respectively below the first or second negative threshold in further response to the first edge having a negative slope.

11. The system of claim 9, wherein the detection circuit comprises a microcontroller configured to:
determine that the piezoelectric actuator connected to the power driver is of a first type in response to the first and second logic voltages being at the asserted levels;
determine that piezoelectric actuator connected to the power driver is of a second type in response to the first logic voltage being at the de-asserted level and the second logic voltage being at the asserted level; and
determine that the piezoelectric actuator is not connected to the power driver in response to the first and second logic voltages being at the de-asserted levels.

12. The system of claim 11, wherein the microcontroller is configured to:
perform a first operation in response to determining that the first type of piezoelectric actuator is connected to the power driver;
perform a second operation in response to determining that the second type of piezoelectric actuator is connected to the power driver; and
perform a third operation in response to determining that no piezoelectric actuator is connected to the power driver.

13. The system of claim 12, wherein the microcontroller is configured to:
control the power driver to send pulses to the piezoelectric actuator at a first rate in response to determining that the second type of piezoelectric actuator is connected to the power driver; and
control the power driver to send pulses to the piezoelectric actuator at a second rate in response to determining that the first type of piezoelectric actuator is connected to the power driver, wherein the second rate is greater than the first rate.

14. The apparatus of claim 1, wherein the parameter comprises a current through the electrical connection.

15. The apparatus of claim 1, wherein the electrical connection comprises a sense resistor, and wherein the parameter comprises a voltage across the sense resistor.

16. An apparatus comprising:
a piezoelectric actuator comprising:
a piezoelectric material configured to expand or contract in response to a drive voltage; and
a rotor frictionally coupled to the piezoelectric material;
a power driver configured to generate the drive voltage, wherein the drive voltage comprises a pulse with a first edge and a second edge, wherein a slope of the first edge is greater than a slope of the second edge to cause the rotor to rotate clockwise due to a coefficient of friction between the piezoelectric material and the rotor during the second edge being greater than a coefficient of friction between the piezoelectric material and the rotor during the first edge, and wherein the measured characteristic is based only on the first edge among the first and second edges of the pulse;
a differential amplifier configured to generate a current-related voltage based on current flowing between the power driver and the piezoelectric actuator in response to a drive voltage;
a circuit configured to generate a first voltage related to an absolute value of the current-related voltage;
a sample and hold circuit configured to generate a second voltage related to a peak of the first voltage; and
a microcontroller configured to:
determine that no piezoelectric actuator is connected to the power driver based on the second voltage; or
determine a type of piezoelectric actuator connected to the power driver based on the second voltage.

17. The apparatus of claim 16, wherein the circuit comprises a rectifier.

18. The apparatus of claim 16, further comprising an analog-to-digital converter configured to generate a digital word based on the second voltage, wherein the microcontroller is configured to receive the digital word to make said determination.

* * * * *